US005736910A

United States Patent [19]

Townsend et al.

[11] Patent Number: 5,736,910

[45] Date of Patent: Apr. 7, 1998

[54] MODULAR JACK CONNECTOR WITH A FLEXIBLE LAMINATE CAPACITOR MOUNTED ON A CIRCUIT BOARD

[75] Inventors: Peter K. Townsend, Camp Hill; Ted R. Meckley, Seven Valleys; David Hatch, Glen Rock; Don McClune; Robert J. Brennan, both of York, all of Pa.

[73] Assignee: Stewart Connector Systems, Inc., Glen Rock, Pa.

[21] Appl. No.: 561,931

[22] Filed: Nov. 22, 1995

[51] Int. Cl.[6] .......... H03H 7/09

[52] U.S. Cl. .......... 333/181; 333/185; 439/620

[58] Field of Search .......... 333/172, 181, 333/182, 183, 184, 185; 361/301.1, 301.2, 301.3, 301.4, 301.5; 439/620

[56] References Cited

U.S. PATENT DOCUMENTS

| | | | |
|---|---|---|---|
| 3,353,124 | 11/1967 | Dilger | 333/172 |
| 3,996,537 | 12/1976 | Neuman | 333/181 |
| 4,263,549 | 4/1981 | Toppeto | 336/176 X |
| 4,384,263 | 5/1983 | Neuman et al. | 333/181 |
| 4,622,526 | 11/1986 | Schneider et al. | 333/181 |
| 4,695,115 | 9/1987 | Talend | 333/184 X |
| 4,726,638 | 2/1988 | Farrar et al. | 333/185 X |
| 4,761,623 | 8/1988 | Schneider | 333/167 |
| 4,772,224 | 9/1988 | Talend | 439/607 |
| 4,863,401 | 9/1989 | Talend | 439/610 |
| 4,930,200 | 6/1990 | Brush, Jr. et al. | 333/185 X |
| 5,244,412 | 9/1993 | Hatch et al. | 439/567 |
| 5,277,625 | 1/1994 | Ianella et al. | 439/620 |
| 5,321,372 | 6/1994 | Smith | 333/1 |
| 5,337,028 | 8/1994 | White | 333/185 X |
| 5,420,553 | 5/1995 | Sakamoto et al. | 333/181 X |
| 5,495,213 | 2/1996 | Ikeda | 333/185 X |

FOREIGN PATENT DOCUMENTS

| | | | |
|---|---|---|---|
| 298282 | 7/1954 | Switzerland | 361/301.4 |
| 483480 | 4/1938 | United Kingdom | 361/301.3 |

*Primary Examiner*—Robert Pascal
*Assistant Examiner*—Justin P. Bettendorf
*Attorney, Agent, or Firm*—Steinberg, Raskin & Davidson, P.C.

[57] ABSTRACT

A modular jack connector mounted on a main printed circuit board and having a receptacle into which a modular plug of an electronic component is inserted. The connector includes a housing, a first set of contacts arranged in the housing each adapted to engage one of the contacts of the plug, a second set of contacts at least partially arranged in the housing and adapted to engaging the main printed circuit board, contact coupling circuit means for electrically coupling the first and second sets of contacts, a capacitor for providing impedance to high frequency noise and interference and a metallic shield at least partially surrounding the housing and connected to a grounding region on the main printed circuit board. In one embodiment, the capacitor is a flexible laminate assembly including first and second conductive sheet members and an intermediate insulative material. Further, the capacitor has a plurality of folded pleats including a first pleat arranged at one end of the laminate assembly and a second pleat arranged at an opposite end of the laminate assembly. The first conductive sheet member is electrically coupled at the first pleat to the contact coupling circuit means, and the second conductive sheet member is electrically coupled at the second pleat to the metallic shield to thereby ground the first set of contacts through the capacitor. The contact coupling circuit means may include toroidal coil pairs which function separately as either a differential mode filter or a common mode filter.

22 Claims, 6 Drawing Sheets

MODULAR JACK CONNECTOR WITH A FLEXIBLE LAMINATE CAPACITOR MOUNTED ON A CIRCUIT BOARD

FIELD OF THE INVENTION

The present invention relates generally to modular jack connectors designed to be mounted on printed circuit boards and, more particularly, to modular jack connectors including components for filtering common and differential mode interference and for eliminating high frequency noise.

BACKGROUND OF THE INVENTION

Electrical devices are frequently subject to adverse operation in the presence of radio frequency interference in the electrical lines connecting the devices to, e.g., data communication lines. The electrical devices are not only susceptible to such interference, they also function as a source of such interference. Filters must therefore be interposed between connected electrical devices to screen out the interference and minimize its effect on the operation of the electrical devices.

This interference may cause two types of distortion of the power circuit wave form, viz., common mode interference where identical wave forms are impressed on the electrical lines connecting the electrical devices, and differential mode interference which appears as a voltage difference between the connecting electrical lines. Circuitry exists to filter radio frequency interference, but for optimum effectiveness and cost, it has been found to be more efficient to treat the two types of interference independently, i.e., to provide one group of electrical components to serve as a common mode filter and another group of electrical components to serve as a differential mode filter.

Since electrical devices are often coupled by modular jack connectors, it is desirable to construct modular jack connectors with integral filter components to avoid the need for additional, external filter components.

In addition, it is desirable for modular jack connectors mounted on printed circuit boards to eliminate noise and interference present in the electrical connection between the plug received in the jack and the printed circuit on which the jack is mounted. To this end, it has been suggested that line-to-ground capacitors be incorporated in the connector to provide low impedance to high frequencies between the lines and ground.

One such connector is described in U.S. Pat. No. 4,695, 115 (Talend). Talend discloses a modular jack in which bypass capacitors engage the contacts in order to pass noise and other high frequency signals to ground. The capacitors are end-mounted ceramic capacitors (tombstone capacitors) and are coupled at one end to contacts in the jack at a location between a terminal mating portion of the contacts and the portion of the contacts that engage a printed circuit board. The capacitors are connected at their other end to a conductive member which in turn is coupled to a grounding region on the printed circuit board so that the capacitors operatively ground the contacts.

It is a disadvantage of the structure of the Talend jack that the capacitance is limited since the size of the ceramic capacitors cannot be increased without correspondingly increasing the size of the jack. Since it is desirable for the jack to have a low profile and to be as small as possible and within industry standards, this prior art jack is not entirely satisfactory. Further, the direct connection between the capacitors and the contacts detrimentally affects the intended signal passing through the contacts.

OBJECTS AND SUMMARY OF THE INVENTION

It is an object of the present invention to provide a new and improved modular jack.

Another object of the present invention is to provide a new and improved modular jack incorporating line filters and bypass capacitors.

Still another object of the present invention is to provide a practical and efficient solution to the connection of a capacitor to electrical current paths through a connector in order to ground the current paths.

It is another object of the present invention to provide a modular jack with capacitance means in which the disadvantages of the prior art modular jacks are substantially eliminated.

It is yet another object of the present invention to provide a modular jack with capacitance means, the capacitance of which is significantly greater than the capacitance of bypass capacitors of prior art jacks, and wherein the size of the modular jack is small and within industry standards.

In accordance with the present invention, these and other objects are attained by providing a modular jack comprising a housing, a first set of contacts for engaging the contacts of a mating plug connector, a second set of contacts for engaging the circuit of the printed circuit board on which the jack is mounted, circuit means for electrically coupling contacts of the first set to contacts of the second set, a capacitor formed of flexible sheet-like materials, preferably formed into a plurality of folded pleats, and a metallic shield at least partially surrounding the housing and electrically coupled to a ground region of the printed circuit board on which the jack is mounted. The capacitor includes two conductive sheet members and an intermediate insulative material. A first one of the conductive sheet members in the capacitor is coupled at one of the extreme capacitor pleats to contacts of the first set and a second one of the conductive sheet members in the capacitor engages the metallic shield at the other extreme capacitor pleat to thereby ground the first set of contacts through the pleated capacitor to eliminate high frequency noise and interference. In a preferred embodiment, the contact coupling circuit means includes a circuit board component arranged within the jack housing. To provide common and differential mode interference filtering, a plurality of toroidal coil pairs are mounted on the circuit board component in the contact coupling circuit means. A first group of the toroidal coil pairs functions as a common mode filter and a second group of the toroidal coil pairs functions as a differential mode filter.

In accordance with another embodiment of the invention, the contacts of the first set of contacts are coupled in pairs to each other and each contact pair is coupled to a capacitor, such as the pleated capacitor described above, through a respective resistor. Only after passing through one of the resistors does the electrical signal from the first set of contacts reach the capacitor. By means of this construction, the capacitor constitutes a center point or center mode or center tap for each pair of contacts of the first set of contacts and establishes a 0-value common mode voltage at the output terminals of the connector. The interposition of a resistor between the capacitor and each pair of contacts of the first set of contacts which engage the contacts of the modular plug provides balanced signal pairs and a balanced circuit without adversely affecting the signal.

It is also significant that only a single capacitor is required in a jack connector according to the invention since each of the contact pairs is connected to the capacitor via a respective resistor and the contact coupling circuit means. Thus, the need for multiple capacitors is avoided.

The jack housing may be provided with any conventional mounting arrangement for mounting the jack on a printed circuit board, such as the arrangement described in U.S. Pat. No. 5,244,412, the specification of which is hereby incorporated by reference.

In an eight position jack according to the invention, i.e., having eight contacts in the first set, adapted to be coupled to a modular plug having only four signal-carrying contacts, only four contacts of the first set are coupled by the contact coupling circuit means to four contacts of the second set. The four remaining unused contacts of the first set are connected in pairs to each other, and each pair of unused contacts is coupled to the capacitor which functions to ground the unused contacts thereby filtering noise and interference. In this embodiment, a resistor may be used to couple each connected pair of unused contacts to the capacitor, in addition to the use of a resistor between coupled pairs of the used contacts of the first set and the capacitor, to provide a balanced circuit.

BRIEF DESCRIPTION OF THE DRAWINGS

Additional objects of the invention will be apparent from the following description of the preferred embodiment thereof taken in conjunction with the accompanying non-limiting drawings, in which.

DETAILED DESCRIPTION OF THE PREFERRED EMBODIMENT

Figure 1:
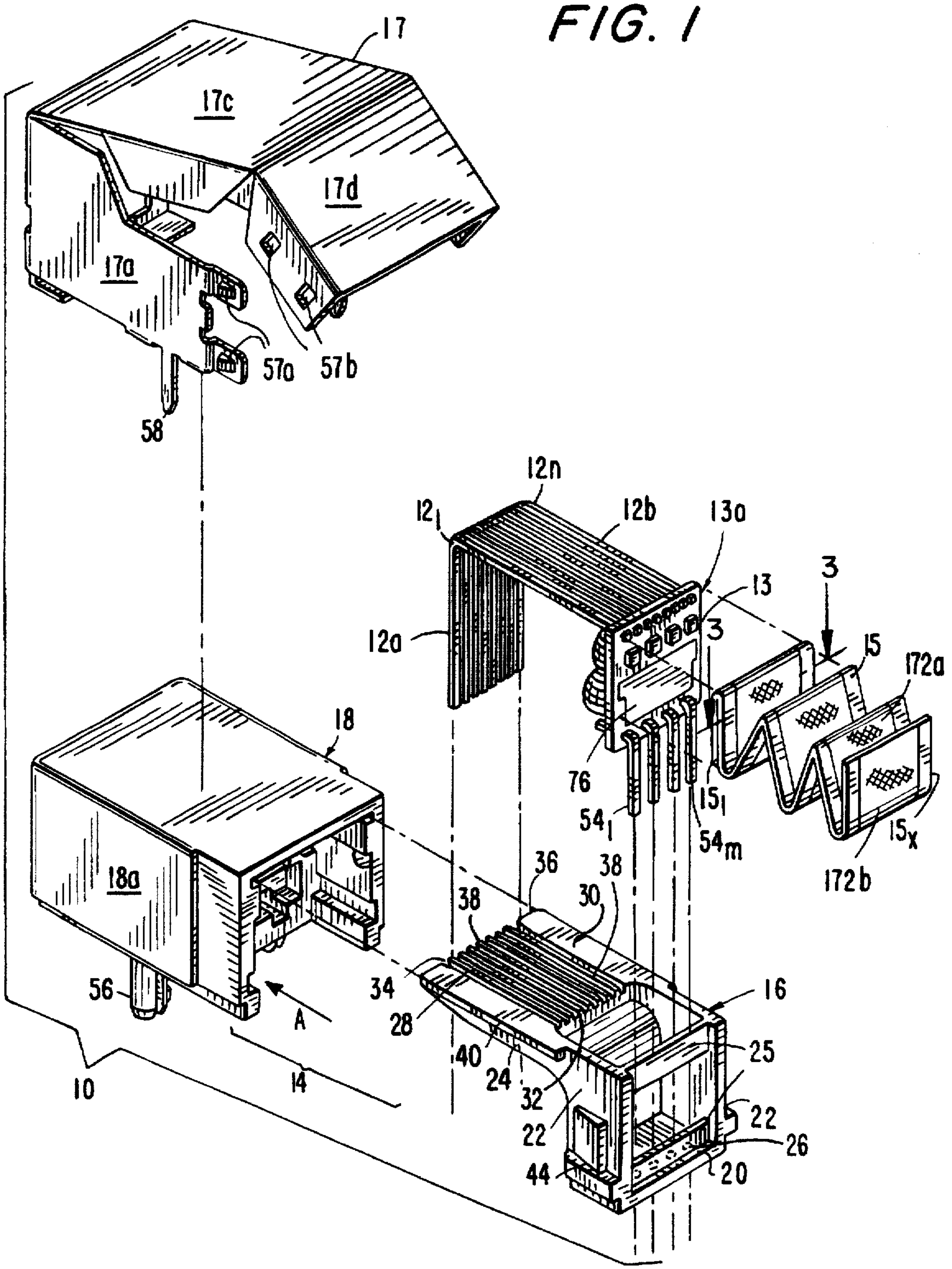
FIG. 1 is an exploded perspective view of a connector in accordance with the invention.

Referring now to FIGS. 1–7 of the drawings wherein like reference characters designate identical or corresponding parts throughout the several views, an embodiment of a device in accordance with the present invention in the form of a modular jack connector 10, adapted to couple an electronic device to the circuit of a printed circuit board through a modular plug connector, comprises a two-part housing 14 formed of an insulative material, such as plastic, a first set of conductive contacts comprising a plurality of contacts $12_1, \ldots, 12_n$, a second set of contacts $54_1, \ldots, 54_m$, a circuit board assembly 13*a* comprising circuit means for electrically coupling the contacts 12 of the first set to the contacts 54 of the second set, a capacitor 15 formed of flexible sheet-like materials formed into a plurality of folded pleats $15_1, \ldots, 15_x$ and a metallic shield 17 which at least partially surrounds the housing 14. The housing 14 includes a first inner housing part 16 and a second outer housing part 18 which together define a receptacle 19 adapted to receive a modular plug. A leg portion 12*a* of each of the first contacts $12_1, \ldots, 12_n$ engages a respective contact of the modular plug received within the receptacle 19.

Referring to FIGS. 1, 4, 5 and 6, the inner housing part 16 is formed of an insulative plastic material and has a substantially L-shaped configuration including a framework section comprising a transverse base portion 20 and a pair of side portions 22 projecting upward from both sides of the base portion 20 (FIG. 1), and a guide section 24 extending forwardly from the top of the framework section in a cantilever fashion. The rear side of the framework section of the inner housing part 16 is partially closed by a pair of transverse upper and lower walls 25 extending between the side portions 22. A significant open space is defined at the rear side of the framework section of the inner housing part 16 between upper and lower walls 25.

A plurality of substantially parallel guide slots or channels 28 are formed in the top surface 30 of the guide section 24 of the inner housing part 16 and each channel 28 is receivable of a leg portion 12*b* of one of the contacts $12_1, \ldots, 12_n$ (FIG. 1). Each channel 28 opens at its rearward end 32 at the open top of the framework section of inner housing part 16 and terminates at its forward end 34 which is recessed rearwardly of the forward edge 36 of the guide section 24 to form fingers 38.

Figure 4:
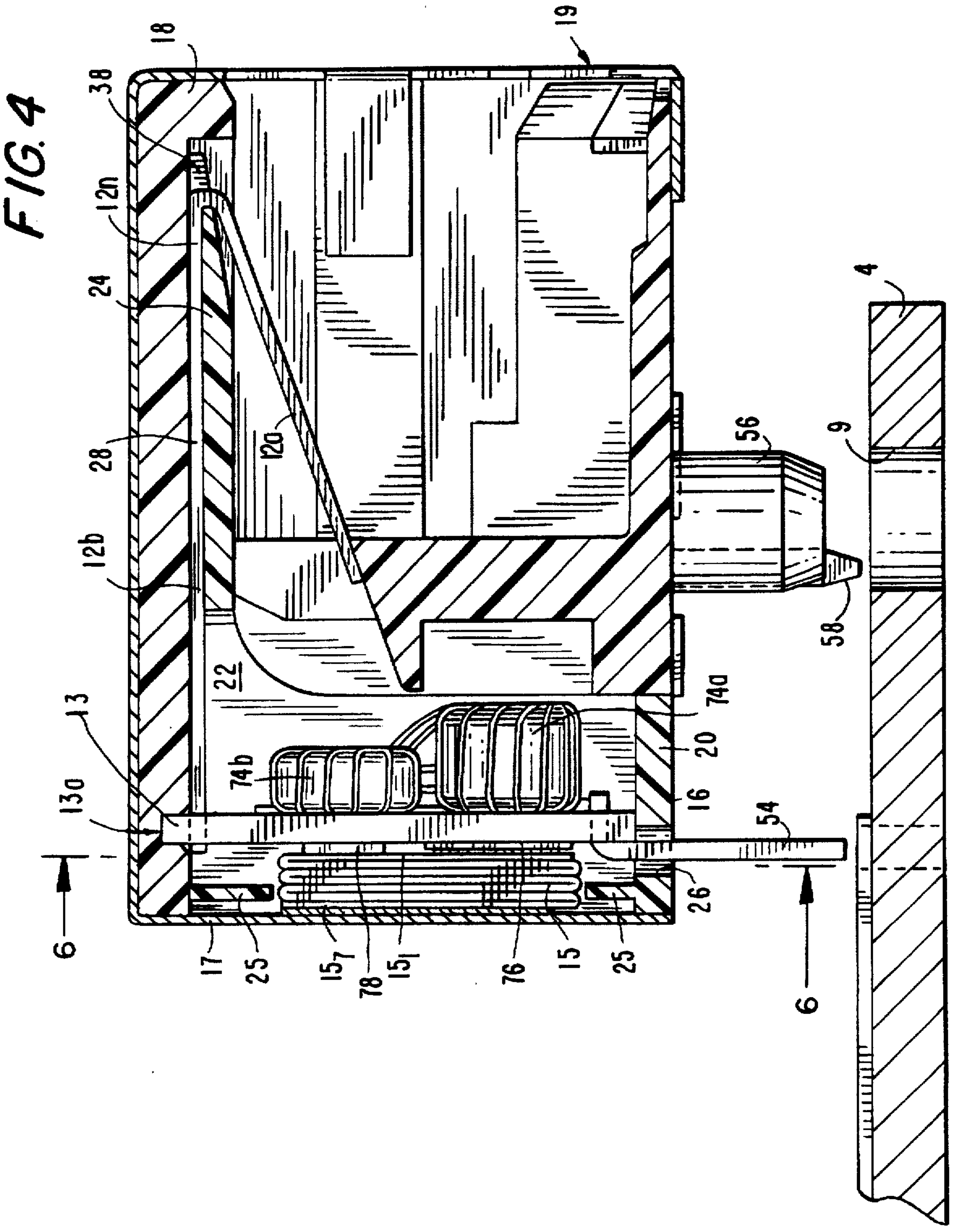
FIG. 4 is a sectional view of the connector taken along line 4—4 of FIG. 2.

As best seen in FIGS. 1 and 4, each of the first set of contacts $12_1, \ldots, 12_n$ has a first leg portion 12*a* extending through the receptacle 19 (FIG. 4) formed in the interior of the housing 14 for engaging a respective one of the plug contacts. The second leg portion 12*b* of each of the contacts $12_1, \ldots, 12_n$ is positioned in a respective one of the channels 28. The rear end of the second leg 12*b* of each contact 12 is attached, e.g., by soldering, to a circuit board component 13 of the circuit board assembly 13*a*. The upper end of each contact $54_1, \ldots, 54_m$ of the second set of contacts is connected to the circuit board component 13 and each second contact 54 extends through a respective bore 26 formed in the base portion 20 for connection at its lower end to the printed circuit board 4 (FIG. 4).

The contact coupling circuit means that couple the contacts 12 of the first set to the contacts 54 of the second set are situated within the framework section of the inner housing part 16. The contact coupling means includes the circuit board component 13 having a printed circuit including a contact element 76 (FIG. 1) and four toroidal coil pairs 70*a*,70*b*,72*a*,72*b* (FIG. 5) mounted on one side of the circuit board component 13. Each of the toroidal coil pairs 70*a*,70*b* comprises a toroidal core 74*b* and two coils 71,73 wound around the core 74*b*. Each of the toroidal coil pairs 72*a*,72*b* comprises a toroidal core 74*a* and two coils 77,79 wound around the core 74*a*.

Figure 5:
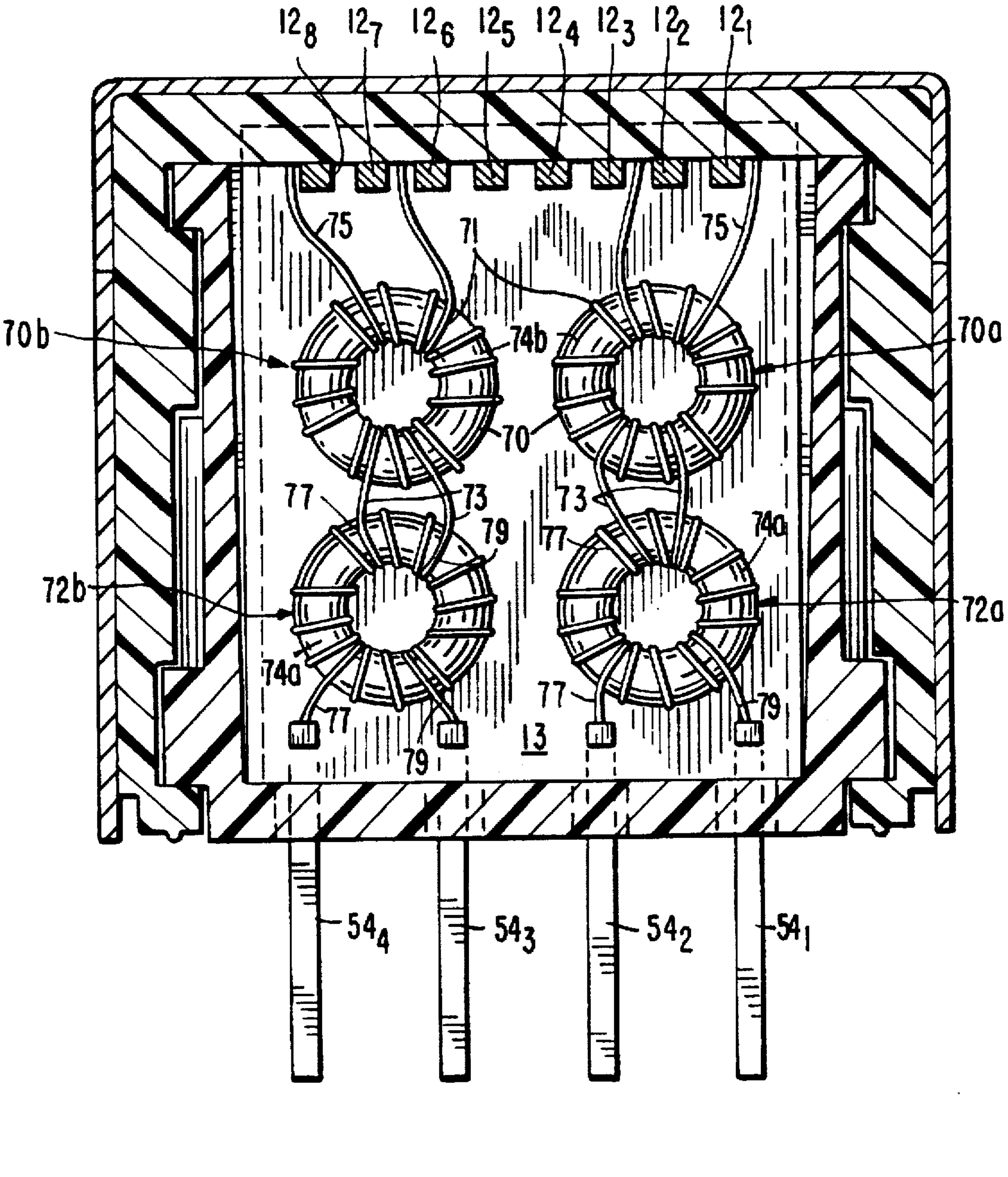
FIG. 5 is a sectional view of the connector taken along line 5—5 of FIG. 2.
Figure 7:
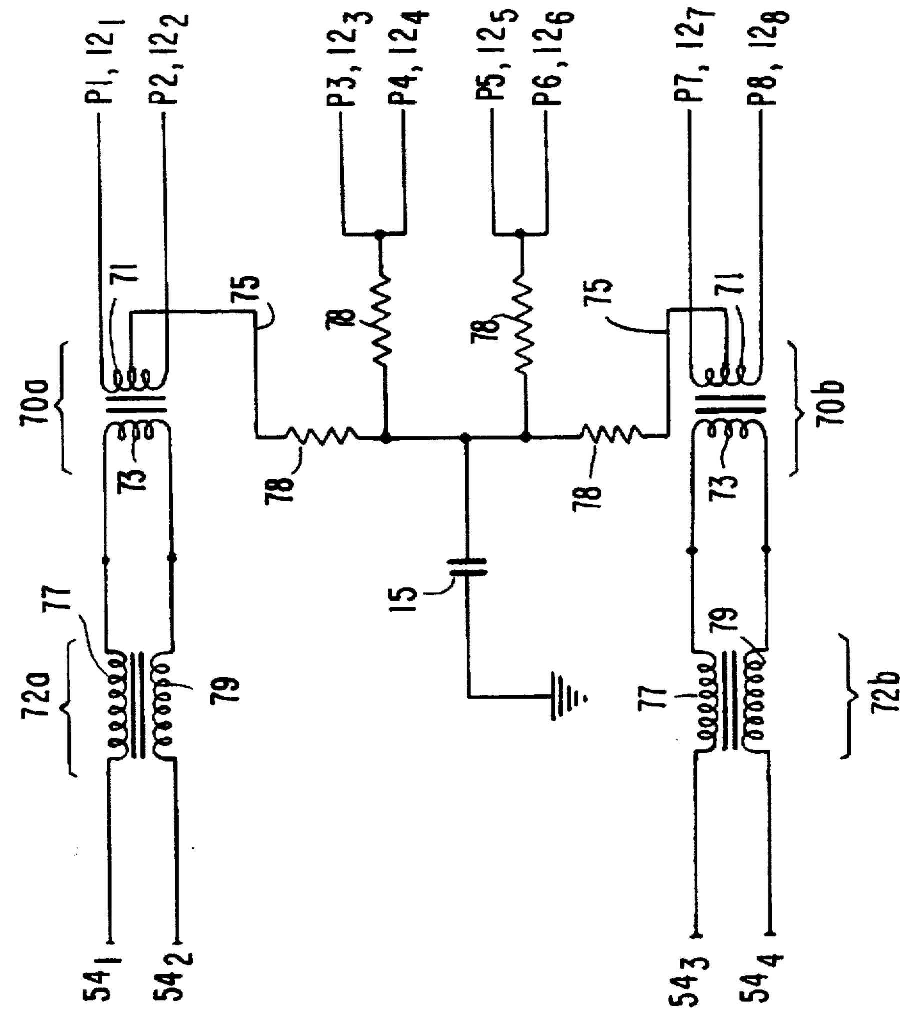
FIG. 7 is a circuit diagram of a jack connector in accordance with the invention.

Referring to FIGS. 5 and 7, one end of coil 71 of toroidal coil pair 70*a* is connected to the contact $12_1$ and the other end of coil 71 is connected to the contact $12_2$. Thus, contacts $12_1$,$12_2$ are coupled to each other via coil 71. Similarly, contacts $12_7$,$12_8$ are coupled to each other via coil 71 of the toroidal coil pair 70*b*. The other coil 73 of each of the toroidal coil pairs 70*a*,70*b* is connected at one end to a coil 79 of a respective one of the toroidal coil pairs 72*a*,72*b* and at its other end to the coil 77 of the respective one of the toroidal coil pairs 72*a*,72*b*. Coils 77,79 are connected at their other ends to respective ones of the contacts 54 of the second set of contacts, i.e., coil 79 of toroidal coil pair 72*a* is connected to contact $54_1$, coil 77 of toroidal coil pair 72*a* is connected to contact $54_2$, coil 79 of toroidal coil pair 72*b* is connected to contact $54_3$, coil 77 of toroidal coil pair 72*b* is connected to contact $54_4$. Thus, as best seen in the circuit diagram shown in FIG. 7, contacts 54 are coupled in pairs to each other via coils 77 of the toroidal coil pairs 72*a*,72*b* which are connected to coils 73 of the toroidal coil pairs 70*a*,70*b* which in turn are connected to coils 79 of the toroidal coil pairs 72*a*,72*b*.

Coils 71,73 are wound around respective toroidal cores 74*b* in a specific manner and incorporated into the contact coupling circuit means so that their current-induced inductive fluxes are additive. As such, toroidal coil pairs 70*a*,70*b* function as differential mode filters. Coils 77,79 of the toroidal coil pairs 72*a*,72*b* are wound around toroidal core 74*a* inductively opposite to each other and are equal in number of turns so that their current-induced fluxes substantially cancel each other. In this case, toroidal coil pairs 72*a*,72*b* thus function as common mode filters. Toroidal coil pairs 72*a*,72*b* are smaller in size than toroidal coil pairs 70*a*,70*b* since while the toroidal coil pairs 70*a*,70*b* must comply with ETHERNET specifications and have a minimum inductance value, there is no standard industry specification for toroidal coil pairs 72*a*,72*b* which function as common mode filters.

With respect to the arrangement of coils on toroidal cores to form toroidal coil pairs which function as either common mode filters or differential mode filters, reference is made to U.S. Pat. Nos. 3,996,537 and 4,263,549. The specifications of these references are incorporated by reference.

Figure 3:
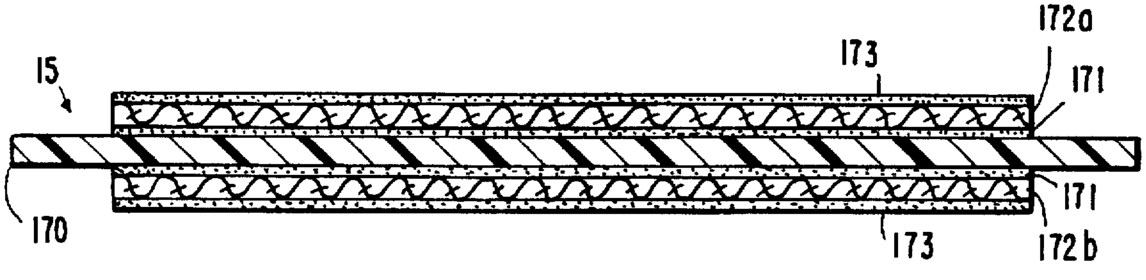
FIG. 3 is a sectional view of the capacitor component of the connector taken along line 3—3 of FIG. 1.

As seen most clearly in FIGS. 1 and 3, the capacitor 15 is a continuous, flexible, elongate laminate assembly formed of a laminate of a sheet 170 of insulative material such as CAPTON™ and a pair of flexible conductive sheet members 172*a*,172*b* formed of wire mesh attached to respective sides of the sheet 170 by conductive adhesive means, such as conductive paste 171 (FIG.3). An insulative coating 173, such as non-conductive paste, is applied to the outer surface of both the sheet members 172*a*,172*b* with regions of the first and last pleats left exposed. In the illustrated embodiment, the capacitor laminate assembly was folded to form seven substantially equal sections or folded pleats $15_1$, . . . , $15_x$, where x=7. An exposed region of the conductive sheet member 172*a* of the first pleat $15_1$ is adjacent to and attached to the contact element 76 arranged on the circuit board component 13 and an exposed region of the conductive sheet member 172*b* of the last pleat $15_7$ is attached to an inner surface of the metallic shield 17 (FIG. 4).

Although the capacitor laminate assembly in the illustrated embodiment has six folds defining seven pleats, the number of pleats in the capacitor 15 depends on the capacitance to be obtained and the dimensions of the conductive sheet members 172*a*,172*b* and the sheet 170 of insulative material. Thus, the capacitor 15 may even be an unfolded flexible laminate assembly provided the capacitance provided thereby is sufficient to enable effective operation of the connector.

The capacitor 15 must have an odd number of pleats, e.g., seven as shown, in order to maintain the proper polarity to ground, i.e., the sheet member 172*a* must be electrically coupled to the circuit means coupled to contacts 12 and the sheet member 172*b* must be electrically coupled to the metallic shield 17.

The construction of the capacitor 15 in this manner, that is as a flexible laminate assembly formed in a plurality of folded pleats, provides significant advantages in the construction and operation of the connector 10. In particular, it enables a significant increase in the capacitance which can be provided in the small space occupied by the capacitor and existing in the interior of the connector. In an experimental embodiment, over 100 Pf of capacitance was obtained by making a five-pleated capacitor from 0.340×2.0 inches of copper sheet mesh with 0.4×2.0 inches of CAPTON™ film. The thickness of the capacitor was about 0.124 inches, the sheet members 172*a*,172*b* having a thickness of about 0.0016 inches, the CAPTON™ sheet 170 having a thickness of about 0.005 inches, the layer of conductive paste 171 between the sheet members 172*a*,172*b* and the CAPTON™ sheet 170 having a thickness of about 0.0014 inches and the layer of non-conductive paste 173 on the outer surface of at least one of the sheet members 172*a*,172*b* having a thickness of about 0.0014 inches.

Figure 6:
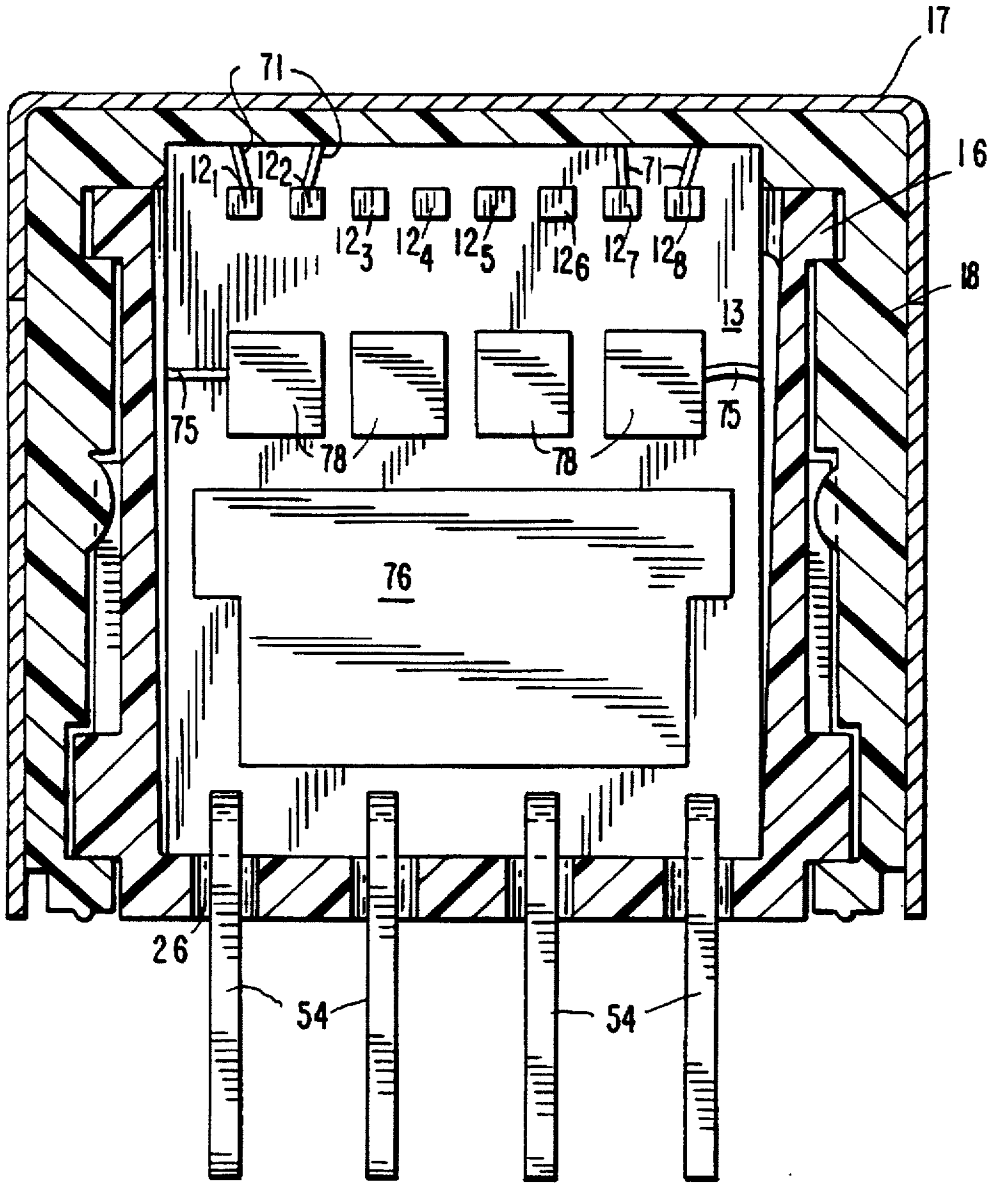
FIG. 6 is a sectional view of the connector taken along line 6—6 of FIG. 4.

Referring now to FIG. 6, the circuit board component assembly 13*a* also includes four resistors 78 mounted on an opposite side of the circuit board component 13 from the side on which the toroidal coil pairs 70*a*,70*b*,72*a*,72*b* are mounted. The contact element 76, to which the capacitor 15 is connected via conductive adhesion means, is also arranged on the same side of the circuit board component 13 as the resistors 78 and is coupled to resistors 78 by the circuitry of circuit board 13. The circuit of the circuit board component 13 provides an electrical connection from each of the resistors 78 to the capacitor contact element 76 to which the capacitor 15 is mounted.

In one embodiment of the invention, a resistor 78 is provided for each pair of contacts 12 of the first set. Each resistor is coupled between each pair of contacts 12 and the capacitor 15 to provide balanced signal pairs and a balanced circuit without adversely affecting the signal.

FIG. 7 illustrates a circuit diagram of the components of an eight position jack, i.e., a jack having eight contacts $12_1$, . . . , $12_8$, in accordance with the invention which is adapted to be coupled to a printed circuit board 4 having only four signal-carrying contacts. Therefore, only four contacts $12_1$, $12_2$,$12_7$,$12_8$ of the first set are coupled by the contact coupling circuit means to four contacts of the second set $54_1$, . . . , $54_4$. The four unused contacts $12_3$, . . . , $12_6$ of the first set are connected in pairs, $12_3$ and $12_4$, $12_5$ and $12_6$, via the appropriate electrical connections on the circuit board component 13 and then each pair is connected to a resistor 78. On the other hand, electrical connections, which may be wires 75, are provided (shown in dotted lines in FIGS. 5 and 6) to couple the resistors 78 which are coupled to the contacts $12_1$,$12_2$,$12_7$,$12_8$ to a respective one of the coils 71.

The contacts $12_3$,$12_4$ are thus connected to each other and to a single resistor 78 and similarly, the contacts $12_5$,$12_6$ are connected to each other and to another resistor 78. Contacts $12_3$,$12_4$,$12_5$,$12_6$ are unused and filtered. Coil 71 of the first toroidal coil pair 70*a* connects contacts $12_1$ and $12_2$ and another coil 71 of the second toroidal coil pair 70*b* connects contacts $12_7$,$12_8$. Wires 75 connect each of the coils 71 to one of the resistors 78. The circuitry on circuit board component 13 includes connections between each of the resistors 78 and capacitor 15. All of the contacts $12_1$, . . . , $12_8$ are thus electrically coupled to the capacitor 15 via the resistors 78. In view of this arrangement, the current path from each pair of the contacts 12 is directed to the capacitor 15 only through one of the resistors 78 providing for balanced signal pairs.

Referring again to FIG. 1, the assembly of the jack 10 will now be described. The contacts $12_1$, . . . , $12_n$ are initially pre-formed with the first and second leg portions 12*a*,12*b* as shown in FIG. 1. The circuit board component assembly 13*a* is also pre-assembled with its electrical-circuit-containing circuit board component 13, and the toroidal coil pairs 70*a*,70*b*,72*a*,72*b*, wires 75, capacitor contact element 76 and resistors 78 mounted on the circuit board component 13 and the pad-engaging contacts $54_1$, . . . , $54_m$ and contacts $12_1$, . . . , $12_n$ connected thereto. Upon insertion of the circuit board assembly 13*a* into the framework of the inner housing part 16, the pad-engaging contacts 54 are inserted through aligned bores 26 in the base portion 20 of the inner housing part 16 and the legs 12*b* of contacts $12_1, \ldots, 12_n$ are inserted into respective ones of the channels 28 in the guide portion 24 of the inner housing part 16 such that the first leg portions 12*a* thereof extend beyond the forward edge of the channels 28.

The sub-assembly of the inner housing part 16, circuit board assembly 13*a* and contacts $12_1, \ldots, 12_n$ is then inserted into the rearward space within outer housing part 18 in the direction of arrow A as shown in FIG. 1. During insertion, the mating contact portions, i.e., the first leg portions 12*a* of contacts $12_1, \ldots, 12_n$, are aligned with respective guide slots formed in the outer housing part 18 between partitions and engage a surface whereby the first leg portions 12*a* are bent into the shape shown in FIG. 4 as insertion of the inner housing part 16 into the outer housing part 18 continues. Other details of the assembly of the inner housing part 16 into the outer housing part 18 can be found in U.S. Pat. No. 5,244,412 referenced above.

Mesh sheet 172*a* at the first pleat $15_1$ of the pleated capacitor 15 is electrically connected to the contact element 76 of the circuit board component 13 by means of a conductive adhesive.

The metallic shield 17 is then applied over the outer housing part 18 of the housing 14 to surround at least a portion of the housing 14 once the capacitor 15, circuit board assembly 13*a* and contacts $12_1, \ldots, 12_n$ are secured in the housing 14. To this end, the metallic shield 17 is constructed with folds corresponding to the edges of the outer housing part 18. To apply the metallic shield 17 about housing 14, first side portions 17*a* (only one of which is shown in FIG. 1) and a front portion 17*b* (FIG. 2) of the metallic shield 17 are positioned abutting corresponding surfaces of the outer housing part 18, i.e., the metallic shield 17 is placed over the outer housing part 18 so that side portions 17*a* engage side portions 18*a* of the housing and the front portion 17*b* of the metallic shield 17 engages with the front, substantially open side of the outer housing part 18 (See FIG. 2). Then, the top surface 17*c* of the metallic shield 17 is brought into engagement with the top surface of the outer housing part 18. Conductive adhesive is applied to connect the parts of the metallic shield 17 to the outer surfaces of the housing 14.

Mesh sheet 172*b* at the last pleat $15_7$ of the pleated capacitor 15 is electrically connected to the rear surface 17*d* of the metallic shield by means of a conductive adhesive.

Figure 2:
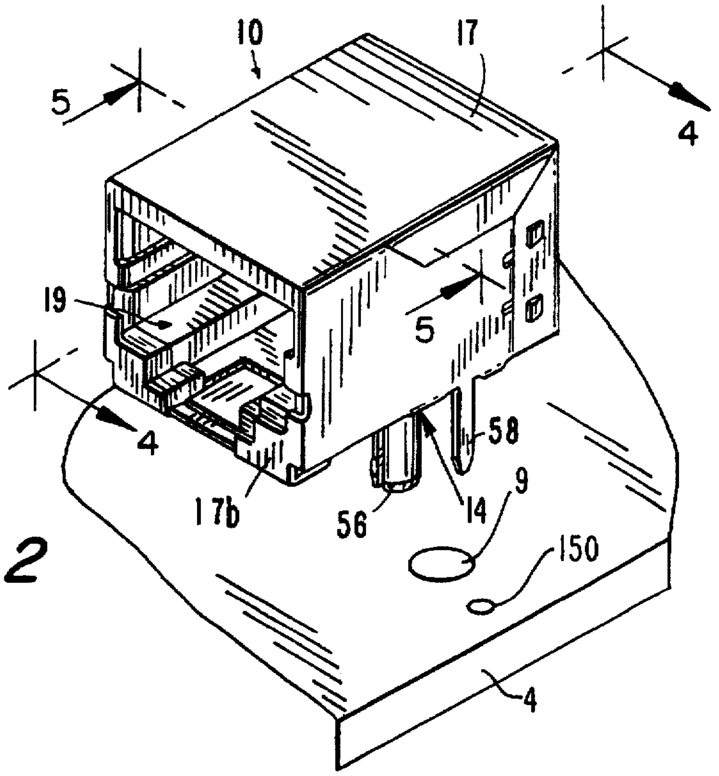
FIG. 2 is a perspective view of the connector of FIG. 1.

The rear surface 17*d* of the metallic shield 17 is bent about the fold between the rear surface 17*d* and the top surface 17*c* to close a rear side of the outer housing part 18, i.e., that side of the outer housing part 18 which is open, through which the inner housing part 16 is inserted into the outer housing part 18 and at which the capacitor 15 is positioned. The rear surface 17*d* of the metallic shield 17 is attached to the side portions 17*a* of the shield 17 by cooperating fastening members 57*a*,57*b* to securely close the shield 17 about the housing 14. In this manner, only a lower portion of the housing 14 and the receptacle 19 for entry of the modular plug are exposed (as shown in FIG. 2) and are not covered by the metallic shield 17. The jack connector 10 is then attached to the printed circuit board 4 by inserting the mounting posts 56 into holes 9 in the printed circuit board 4.

Electrical connection of the metallic shield 17 to the printed circuit board 4 is facilitated by metallic tabs 58 extending from the lower surface of the side portions 17*a* of the metallic shield 17. Tabs 58 are soldered to a grounding region 150 (FIG. 2) on the printed circuit board 4 to operatively ground the metallic shield 17 and thus ground the first set of contacts $12_1, \ldots, 12_n$ coupled thereto through the capacitor 15 and the circuit board component 13.

The examples provided above are not meant to be exclusive. Many other variations of the present invention would be obvious to those skilled in the art, and are contemplated to be within the scope of the appended claims. For example, although in the illustrated embodiment a printed circuit board component is contained within the connector, in a more basic embodiment, it is possible to dispense with the printed circuit board component and toroidal coil pairs attached thereto, and to connect the pleated capacitor via resistors to the contacts themselves or to some electrical coupling means which couple the contacts which engage the contacts of the mating plug and the contacts which engage the printed circuit board. Also, it is possible to dispense with the circuit board component altogether and to mount the toroidal coil pairs, resistors, capacitor and contact coupling circuit means on the housing, e.g., interior walls of the housing.

We claim:

1. A modular connector for mounting on a main printed circuit board and for receiving a plug, comprising a housing, a first set of contacts arranged in said housing each adapted to engage one of the contacts of the plug, a second set of contacts at least partially arranged in said housing and adapted to engage the main printed circuit board, a contact coupling printed circuit board for electrically coupling said first and second sets of contacts, said contact coupling printed circuit board providing a signal path between respective ones of the first and second sets of contacts, a capacitor comprising a flexible laminate assembly including first and second flexible conductive sheet members and an intermediate insulative material, said first conductive sheet member being electrically coupled to said contact coupling printed circuit board, and a metallic shield at least partially surrounding said housing for connecting to a grounding region on the main printed circuit board, said second conductive sheet member being electrically coupled to said metallic shield to thereby ground said first set of contacts through said capacitor.

2. The connector of claim 1, wherein said contact coupling printed circuit board is arranged in said housing, said first and second sets of contacts being connected to said contact coupling printed circuit board, and further including a plurality of toroidal coil pairs mounted on said contact coupling printed circuit board and coupled to said first and second sets of contacts, a first group of said toroidal coil pairs functioning as a common mode filter and a second group of said toroidal coil pairs functioning as a differential mode filter.

3. The connector of claim 1, wherein said contact coupling printed circuit board includes a plurality of toroidal coil pairs coupled to said first and second sets of contacts, a first group of said toroidal coil pairs functioning as a common mode filter and a second group of said toroidal coil pairs functioning as a differential mode filter.

4. The connector of claim 1, further comprising a plurality of resistors, at least a portion of said resistors being coupled to said contact coupling printed circuit board.

5. The connector of claim 4, wherein said contact coupling circuit printed circuit board couples pairs of said first set of contacts, each pair of contacts of said first set of contacts being coupled to said capacitor through one of said resistors.

6. The connector of claim 4, wherein said housing comprises a receptacle having eight contacts, said first set of contacts comprising four of said eight contacts, said resistors comprising four resistors, said contacts of said first set of contacts being coupled in pairs through one of said resistors to said capacitor and said four contacts not constituting said first set of contacts being coupled in pairs through one of said resistors to said capacitor such that balanced signal pairs are provided.

7. The connector of claim 4, wherein the plurality of resistors are mounted on said contact coupling printed circuit board.

8. The connector of claim 1, wherein said capacitor has a plurality of folded pleats including a first pleat arranged at one end of said laminate assembly and a second pleat arranged at an opposite end of said laminate assembly, said first conductive sheet member being electrically coupled at said first pleat of said capacitor to said contact coupling printed circuit board, and said second conductive sheet member being electrically coupled at said second pleat of said capacitor to said metallic shield to thereby ground said first set of contacts through said capacitor.

9. The connector of claim 8, wherein said capacitor has an odd number of pleats in order to maintain the proper polarity to ground.

10. The connector of claim 1, further comprising a capacitor engaging pad mounted on said contact coupling printed circuit board, said first conductive sheet member being electrically coupled to said capacitor engaging pad.

11. A modular connector for mounting on a main printed circuit board and for receiving a plug, comprising a housing including a receptacle for receiving a plug having eight contacts;

a first set of eight contacts arranged in said housing, each contact of the first set of eight contacts adapted to engage a respective contact of the plug, the first set of eight contacts forming four first contact pairs;

a second set of four contacts at least partially arranged in said housing for engaging the main printed circuit board, each contact of the second set of contacts being electrically coupled to a respective contact of the first set of contacts;

a set of four resistors, each resistor having a first end and a second end, the first end of each resistor coupled to a respective first contact pair;

a capacitor having a first end and a second end, the first end of the capacitor coupled to ground;

a common node, coupled to the second end of the capacitor and to the second end of each of the resistors, for providing balanced signal pairs and impedance to high frequency noise and interference.

12. A modular connector for mounting on a main printed circuit board and for receiving a plug, comprising a housing, a first set of contacts arranged in said housing each adapted to engage a respective contact of the plug, a second set of contacts at least partially arranged in said housing for engaging the main printed circuit board, a contact coupling printed circuit board arranged in said housing for electrically coupling said first and second sets of contacts, said contact coupling printed circuit board providing a signal path between respective ones of the first and second sets of contacts, a capacitor coupled to said contact coupling printed circuit board for providing impedance to high frequency noise and interference, said capacitor including first and second conductive members, said first conductive member being electrically coupled to said contact coupling printed circuit board, and a metallic shield at least partially surrounding said housing, the metallic shield for connection to a grounding region on the main printed circuit board, said second conductive sheet member being electrically coupled to said metallic shield to thereby ground said first set of contacts through said capacitor.

13. A modular connector for mounting on a main printed circuit board and for receiving a plug, comprising a housing, a first set of contact pairs arranged in said housing each of said first contact pairs adapted to engage a respective contact pair of the plug, a second set of contact pairs at least partially arranged in said housing for engaging the main printed circuit board, each of the second contact pairs being electrically coupled to a respective one of the first contact pairs;

a respective resistor for each first contact pair, each resistor having a first end and a second end, the first end of each resistor coupled to its respective first contact pair;

a capacitor having a first end and a second end, the first end of the capacitor coupled to ground;

a common node, coupled to the second end of the capacitor and to the second end of each of the resistors, for providing balanced signal pairs and impedance to high frequency noise and interference.

14. The connector of claim 13, wherein said capacitor comprises a flexible laminate assembly, said first and second ends of said capacitor being first and second conductive sheet members, respectively, said first conductive sheet member being electrically coupled to said common node and said second conductive sheet member being electrically coupled to ground.

15. The connector of claim 14, wherein said capacitor has a plurality of folded pleats including a first pleat arranged at one end of said laminate assembly and a second pleat arranged at an opposite end of said laminate assembly, said first conductive sheet member being electrically coupled at said first pleat to said contact coupling printed circuit board and said second conductive sheet member being electrically coupled at said second pleat to ground.

16. The connector of claim 15, wherein said capacitor has an odd number of pleats in order to maintain the proper polarity to ground.

17. The connector of claim 13, wherein each first contact pair is coupled to its respective second contact pair via a respective first toroidal coil pair and a respective second toroidal coil pair each first toroidal coil pair functioning as a common mode filter and each second toroidal coil pair functioning as a differential mode filter.

18. The connector of claim 17, further comprising a printed circuit board connected to the first set of contacts, the second set of contacts, and the capacitor, the printing circuit board having the resistors and the toroidal coil pairs mounted thereon, the printed circuit board including a circuit which electrically couples each of the second set of contacts to the respective one of the first set of contacts through the toroidal coil pairs, and which electrically couples each resistor to a respective first contact pair, and which electrically couples the capacitor and the resistors to the common node.

19. The connector of claim 13, further comprising a printed circuit board connected to the first set of contacts, the second set of contacts, and the capacitor, the printing circuit board having the resistors mounted thereon, the printed circuit board including a circuit which electrically couples each of the second set of contacts to the respective one of the first set of contacts, and which electrically couples each resistor to a respective first contact pair, and which electrically couples the capacitor and the resistors to the common node.

20. The connector of claim 19, further comprising a capacitor engaging pad mounted on, and electrically coupled to, said contact coupling printed circuit board, said first end of the capacitor being electrically coupled to said capacitor engaging pad.

21. The connector of claim 13, further comprising a metallic shield at least partially surrounding said housing, the metallic shield for connecting to a grounding region on the main printed circuit board, said first end of the capacitor being electrically coupled via said metallic shield to ground.

22. The connector of claim 13, wherein the capacitor includes first and second conductive members and an intermediate insulative material, said first conductive member forming the first end of the capacitor, the second conductive member forming the second end of the capacitor.

* * * * *

US005736910C1

(12) EX PARTE REEXAMINATION CERTIFICATE (7251st)

United States Patent

Townsend et al.

(10) Number: US 5,736,910 C1

(45) Certificate Issued: Dec. 22, 2009

(54) MODULAR JACK CONNECTOR WITH A FLEXIBLE LAMINATE CAPACITOR MOUNTED ON A CIRCUIT BOARD

(75) Inventors: Peter K. Townsend, Camp Hill, PA (US); Ted R. Meckley, Seven Valleys, PA (US); David Hatch, Glen Rock, PA (US); Don McClune, York, PA (US); Robert J. Brennan, York, PA (US)

(73) Assignee: Bel Fuse Ltd., San Po Kong, Kowloon (HK)

Reexamination Request:
No. 90/009,202, Jun. 26, 2008

Reexamination Certificate for:

| | |
|---|---|
| Patent No.: | **5,736,910** |
| Issued: | **Apr. 7, 1998** |
| Appl. No.: | **08/561,931** |
| Filed: | **Nov. 22, 1995** |

(51) Int. Cl.
*H01R 13/719* (2006.01)
*H01R 13/66* (2006.01)

(52) U.S. Cl. ........................................ 333/181; 333/185

(58) Field of Classification Search .................. 333/172, 333/181, 182, 183, 184, 185; 361/301.1, 361/301.2, 301.3, 301.4, 301.5
See application file for complete search history.

(56) References Cited

U.S. PATENT DOCUMENTS

| | | | | |
|---|---|---|---|---|
| 3,353,124 A | | 11/1967 | Dilger | |
| 4,789,847 A | | 12/1988 | Sakamoto et al. | |
| 4,930,200 A | * | 6/1990 | Brush et al. ................ | 29/25.42 |
| 5,337,028 A | | 8/1994 | White | |
| 5,587,884 A | | 12/1996 | Raman | |

OTHER PUBLICATIONS

"Connecting the DECchip 21140 PCI Fast Ethernet LAN Controller to the Network: An Application Note," Digital Equipment Corporation, Maynard, Massachusetts, Order No. EC–QAR2A–TE, Dec. 14, 1994 (the DEC 21140 Applicaton Note).

* cited by examiner

*Primary Examiner*—Alexander J Kosowski

(57) ABSTRACT

A modular jack connector mounted on a main printed circuit board and having a receptacle into which a modular plug of an electronic component is inserted. The connector includes a housing, a first set of contacts arranged in the housing each adapted to engage one of the contacts of the plug, a second set of contacts at least partially arranged in the housing and adapted to engaging the main printed circuit board, contact coupling circuit means for electrically coupling the first and second sets of contacts, a capacitor for providing impedance to high frequency noise and interference and a metallic shield at least partially surrounding the housing and connected to a grounding region on the main printed circuit board. In one embodiment, the capacitor is a flexible laminate assembly including first and second conductive sheet members and an intermediate insulative material. Further, the capacitor has a plurality of folded pleats including a first pleat arranged at one end of the laminate assembly and a second pleat arranged at an opposite end of the laminate assembly. The first conductive sheet member is electrically coupled at the first pleat to the contact coupling circuit means, and the second conductive sheet member is electrically coupled at the second pleat to the metallic shield to thereby ground the first set of contacts through the capacitor. The contact coupling circuit means may include toroidal coil pairs which function separately as either a differential mode filter or a common mode filter.

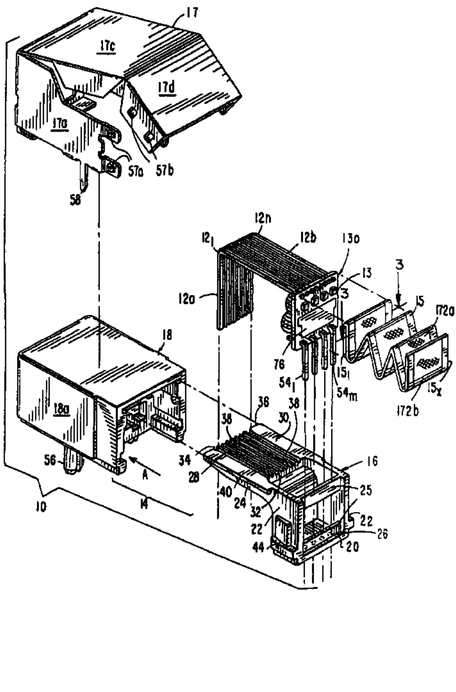

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–22 is confirmed.

* * * * *